(12) United States Patent
Ogawa et al.

(10) Patent No.: US 7,384,710 B2
(45) Date of Patent: Jun. 10, 2008

(54) METHOD OF FORMING EXPOSURE MASK PATTERN, EXPOSURE MASK PATTERN, AND METHOD OF PRODUCING SEMICONDUCTOR DEVICE

(75) Inventors: Kazuhisa Ogawa, Kanagawa (JP); Kazuyoshi Kawahara, Kanagawa (JP)

(73) Assignee: Sony Corporation (JP)

( * ) Notice: Subject to any disclaimer, the term of this patent is extended or adjusted under 35 U.S.C. 154(b) by 686 days.

(21) Appl. No.: 10/503,363

(22) PCT Filed: Feb. 7, 2003

(86) PCT No.: PCT/JP03/01293

§ 371 (c)(1),
(2), (4) Date: Aug. 3, 2004

(87) PCT Pub. No.: WO03/067331

PCT Pub. Date: Aug. 14, 2003

(65) Prior Publication Data

US 2005/0147893 A1 Jul. 7, 2005

(30) Foreign Application Priority Data

Feb. 8, 2002 (JP) ............................. 2002-031866

(51) Int. Cl.
*G03F 1/14* (2006.01)
*G03F 7/20* (2006.01)
*G21K 5/00* (2006.01)
*H01J 37/00* (2006.01)
*G06F 17/50* (2006.01)

(52) U.S. Cl. ................. 430/5; 430/296; 430/311; 250/492.22; 378/34; 716/19

(58) Field of Classification Search ................. 430/5; 716/19–21
See application file for complete search history.

(56) References Cited

U.S. PATENT DOCUMENTS

| 5,631,110 A * | 5/1997 | Shioiri et al. ................ 430/5 |
| 6,221,539 B1 | 4/2001 | Kotani et al. |
| 6,453,457 B1 * | 9/2002 | Pierrat et al. .............. 716/19 |
| 2004/0019869 A1 * | 1/2004 | Zhang ....................... 716/11 |
| 2004/0205688 A1 * | 10/2004 | Pierrat ....................... 716/21 |

FOREIGN PATENT DOCUMENTS

| JP | 9-251940 A | 9/1997 |
| JP | 2000-098584 | 4/2000 |
| JP | 2000-187314 | 7/2000 |
| JP | 2000-187314 A | 7/2000 |
| JP | 2001-174974 | 6/2001 |
| JP | 2001-174974 A | 6/2001 |

OTHER PUBLICATIONS

International Search Report; International Application No. PCT/JP03/01293; International search report mailing date: Apr. 30, 2003.

* cited by examiner

*Primary Examiner*—Mark F. Huff
*Assistant Examiner*—John Ruggles
(74) *Attorney, Agent, or Firm*—Rader Fishman & Grauer PLLC; Ronald P. Kananen

(57) ABSTRACT

A method of forming an exposure mask pattern providing edge division points P at edges of a design pattern (1) by predetermined intervals and correcting edge positions for each divided edge portion, wherein, for the design pattern (1), rectangular patterns (10) and (11) are formed having pairs of facing long sides and facing short sides in the design pattern (1). The rectangular patterns (10) and (11) are formed at portions having widths W1a and W2a of the long sides in the design pattern (1) within a predetermined interval W0, so that W1a≦W0 and W2a≦W0. Next, at each of the rectangular patterns (10) and (11), new edge division points P (P₁) are given along each of the facing long sides at predetermined intervals t from start points P₀ sharing a short side. Due to this, the exposure mask pattern used for lithography can be simplified and the precision of formation of a transfer pattern can be improved.

19 Claims, 9 Drawing Sheets

METHOD OF FORMING EXPOSURE MASK PATTERN, EXPOSURE MASK PATTERN, AND METHOD OF PRODUCING SEMICONDUCTOR DEVICE

TECHNICAL FIELD

The present invention relates to a method of forming an exposure mask pattern and an exposure mask pattern, more particularly, a method of forming an exposure mask pattern using model base proximity effect correction and an exposure mask pattern able to be obtained by the same, and a method of producing a semiconductor device.

BACKGROUND ART

In the process of producing a semiconductor device, ion implantation and pattern etching are performed using resist patterns as a mask.

However, it is known that a resist pattern obtained by lithography and a transfer pattern formed by an etching after that suffer from variations in dimensional precision due to process conditions, the density of arrangement of patterns, underlayer conditions, and other various factors. This variation in dimensional precision becomes a factor causing short-circuits between patterns, disconnection, and other defects.

Therefore, in recent years, for obtaining a transfer pattern closer to a design pattern, so-called "optical proximity effect correction" (hereinafter referring to as "OPC") has been performed to correct the design pattern to obtain a mask pattern for exposure (that is, "exposure mask pattern"). From this, model-base OPC is a method, as shown in FIG. 11, of giving edges of a design pattern 1, shown by a broken line in the figure, edge division points P, performing simulation of light intensity using the centers between edge division points P as evaluation points, automatically determining amounts of correction for the edge positions between the edge division points P based on the obtained simulation results, and thereby forming the exposure mask pattern 3.

The shape of the exposure mask pattern 3 given by the above model-base OPC is determined by an interval t between the edge division points P. If the interval t is large, the correction becomes that much rougher, and therefore improvement of the precision of the transfer pattern obtained by lithography using the exposure mask pattern is difficult. As opposed to this, if the interval t between the edge division points P is small, the exposure mask pattern 3 ends up becoming complicated, production becomes difficult, and the production cost of the mask increases. Further, due to the occurrence of fine patterns, defect inspections become impossible and sometimes fabrication of a mask guaranteed against defects becomes impossible. Therefore, in model-base OPC, the interval t between the edge division points P is set so as to secure the shape precision of a transfer pattern and to enable fabrication of a mask guaranteed against defects.

Further, when giving edge division points P to a design pattern 1, as shown in FIG. 12, using the vertexes $P_0$ of the design pattern 1 as start points, edge division points P are successively given in accordance with the set interval t.

However, when using the vertexes of a design pattern as start points and successively giving edge division points, the interval between the position of a start point and an edge division point may result in "deviation" in the positions of the edge division points at facing edge portions. For example, in the L-shaped design pattern 1 shown in FIG. 12, if using the vertexes of the design pattern 1 as the start points $P_0$, setting the interval t, and successively giving edge division points P, as long as the interval t does not match with the line widths W1 and W2 of the design pattern 1, as illustrated, "deviation" will occur at the positions of the edge division points P at facing edge portions.

In this case, as shown in FIG. 11, the edge portions of the exposure mask pattern 3 obtained by correction of the design pattern 1 become shifted in a step manner between facing edge portions. Therefore, despite setting the interval t between the edge division points P as explained above, the exposure mask pattern 3 becomes complicated, formation of the exposure mask pattern 3 becomes difficult, the mask cost increases, and fabrication of a mask guaranteed against defects becomes difficult.

Further, when using an exposure mask pattern 3 formed in this way to fabricate an exposure mask, the data of the exposure mask pattern 3 (so-called "mask data") is divided into individual rectangular portions. Therefore, the exposure mask pattern 3 is divided by division lines 7 provided perpendicularly from the edge division points P to the edges, if necessary, and electron beam lithography is performed using each divided pattern 9 portion as a shot area.

However, when forming an exposure mask pattern 3 having "deviation" at the edge portions as mentioned above with rectangular divided patterns 9, divided patterns 9 that have sides smaller than the interval t between the edge division points P are formed. Therefore, despite the interval t of the edge division points P being set as explained above, the number of the divided patterns 9 increases. This becomes a factor inviting an increase of the number of the shots in exposure when producing a mask and deterioration of the TAT (turn-around time).

DISCLOSURE OF THE INVENTION

The present invention for solving the above problem provides a method of forming an exposure mask pattern having the steps of giving edge division points to edges of a design pattern by predetermined intervals and correcting the edge positions at each divided edge portion characterized by the following. First, in the design pattern, a rectangular pattern is formed using a pair of facing sides comprising that design pattern. Next, using the two vertexes sharing one side of the rectangular pattern as start points, edge division points are given to the facing sides by predetermined intervals starting from these start points. After that, the divided edge portions are corrected for edge position so as to form the exposure mask pattern. Further, the present invention also provides an exposure mask pattern obtained by this method and also a method of producing a semiconductor device including pattern exposure using this exposure mask pattern.

In the above method of forming an exposure mask pattern, exposure mask pattern, and method of producing a semiconductor device, since edge division points are set at facing sides of a rectangular pattern by predetermined intervals from two vertexes sharing one side of the rectangular pattern, the edge division points are provided at the facing sides with no "deviation" in the direction of extension of the facing sides. Therefore, when correcting the edge positions in the edge portions divided by the edge division points, the corrected edge portions cannot be arranged in the direction of extension of the facing sides in a step manner. Accordingly, when dividing an exposure mask pattern obtained by the above correction in the direction of extension of the facing sides to divide it into rectangular divided pattern portions, the interval between the edge division points becomes the minimum unit of division and the number of the rectangular divided patterns is kept to no more than the number of portions between the edge division points. Due to this, the shape of the exposure mask pattern is simplified, guarantee of the mask against defects becomes easy, and a transfer pattern having a high precision with respect to the design pattern can be formed. Note that the above rectangular pattern may be a rectangle or a square. Further, the interval of provision of the division points may be a constant value.

In the step of forming the rectangular patterns, by making portions of the design pattern having a distance between the facing sides within a predetermined interval the rectangular patterns, in a long pattern having a bent part, the rectangular patterns are formed at portions other than the pattern comprising the bent part. Therefore, when providing the edge division points at the facing sides of the rectangular patterns, edge division points being given inside the design pattern can be prevented.

Since the above correction is optical proximity effect correction, a transfer pattern closer to the design pattern is obtained by lithography of performing pattern exposure using the exposure mask pattern obtained by the above correction.

Further, according to the method of producing a semiconductor device performing pattern exposure of an exposure mask pattern obtained in this way, when dividing an exposure mask pattern obtained by the above correction in the direction of extension of the facing sides to divide it into rectangular divided patterns, the interval between the edge division points becomes the minimum unit of division, the number of the rectangular divided patterns is kept to no more than the number of portions between the edge division points, an increase of the number of the mask data and the number of the exposure shots when producing a mask, and deterioration of the TAT (turn-around time) due to this can be prevented.

Further, in this method of producing a semiconductor device, when the pattern exposure is performed using an exposure mask having exposure mask patterns, the amount of data of the exposure mask can be reduced. On the other hand, when the pattern exposure is lithographic exposure, the number of the exposure shots can be reduced.

Further, if the pattern exposure is electron beam exposure, X-ray exposure, or photo exposure, in particular, for such pattern exposure using an exposure mask requiring fine patterns or high density patterns, an increase of the amount of the mask data and the number of shots in the pattern exposure when producing the mask and deterioration of the TAT can be effectively prevented.

BEST MODE FOR CARRYING OUT THE INVENTION

Below, an embodiment of the present invention will be explained based on the drawings. Here, an embodiment will be explained taking as an example forming an exposure mask pattern using the present invention for model-base oOPC and forming a transfer pattern of a L-shaped design pattern by lithography.

Figure 1A:
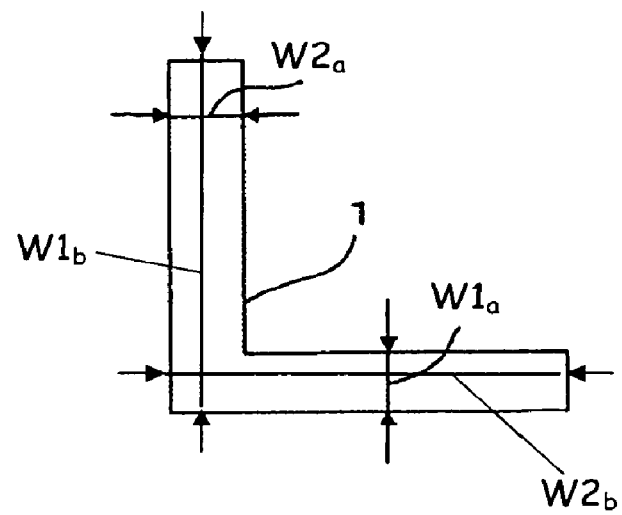
FIGS. 1A to 1C are process drawings showing an embodiment of the present invention.

First, as shown in FIG. 1A, the different parts of the L-shaped design pattern are checked for the line widths W1 (including $W1_a$ and $W1_b$) and W2 (including $W2_a$ and $W2_b$) along a direction of extension (longitudinal direction). At that time, assume that the intervals between the facing sides of the design pattern 1 along the two directions serving directions of extension of the design pattern 1 (for example, the two perpendicular x- and y-directions) are detected as the line widths W1 and W2.

Figure 1B:
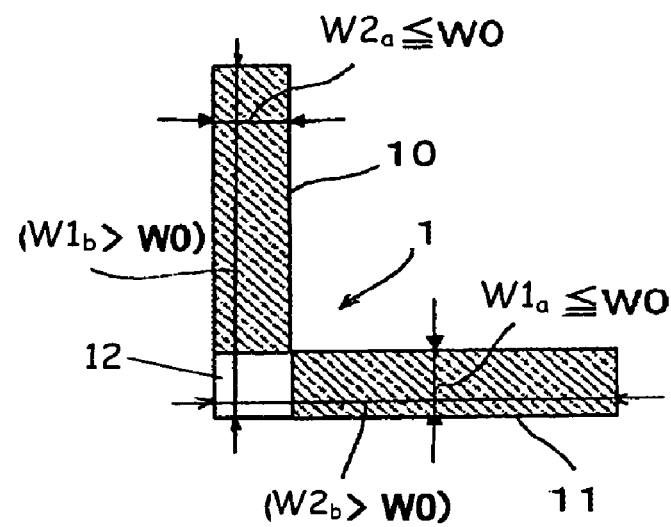

Next, as shown in FIG. 1B, the portions where the line widths W1 and W2 detected by the above check that are not more than the set interval WO are made the rectangular patterns 10 and 11. Here, the interval WO is, for example, set to the thickest design line width in the design pattern. Due to this, in the present embodiment, two locations of the L-shape become the rectangular patterns 10 and 11. Further, The portions of the design pattern where (W1>WO) and (W2>WO) are not recognized as part of a rectangular pattern, so the L-shaped bent portion is not fitted with a rectangular pattern. Further, at least one side of each rectangular patterns is positions over a side of the design pattern. Further, the method of setting the rectangular patterns in the design pattern is not limited to this technique and may be any technique where a rectangular pattern is not positioned over a bent portion of the design pattern. Further, the "rectangular pattern" may be a square.

Figure 1C:
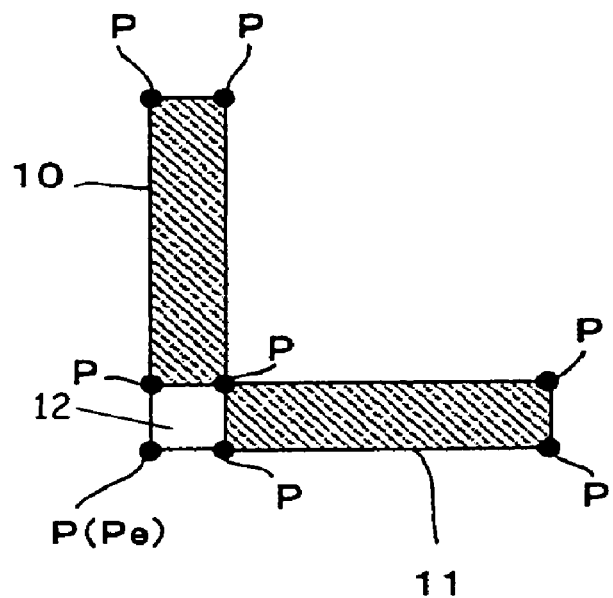

After this, as shown in FIG. 1C, the four vertexes of each of the rectangular patterns 10 and 11 formed are given edge division points P. Further, the vertex (here, one) of the L-shaped portion 12 excluded from the formed rectangular patterns 10 and 11 is also given an edge division point P (Pe).

Figure 2A:
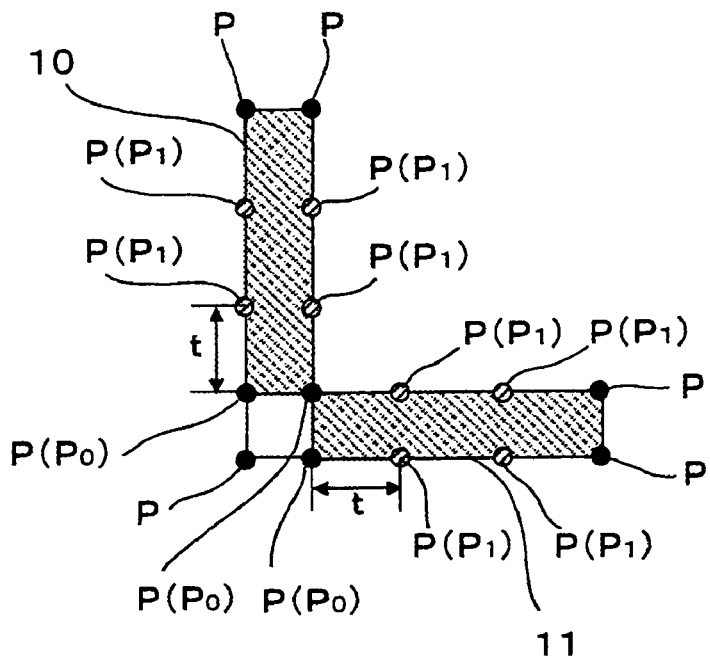
FIGS. 2A and 2B are process drawings showing an embodiment of the prevent invention.

Next, as shown in FIG. 2A, at each of the 15 rectangular patterns 10 and 11, edge division points P positioned at the two vertexes sharing one short side are used as start points $P_0$, and new edge division points P ($P_1$) are successively positioned from these start points P0 along the facing sides (long sides) of the rectangular patterns 10 and 11 at predetermined intervals t.

Further, the figure shows in the case where all edge division points P ($P_1$) are given at the same predetermined intervals t (that is, constant values). However, what is important here is that the new edge division points $P_1$ are successively given from the two start points $P_0$ sharing a short side to the facing sides at predetermined intervals t according to a similar rule. Therefore, the intervals of the edge division points P adjoining in the long side direction may be different from each other.

Figure 2B:
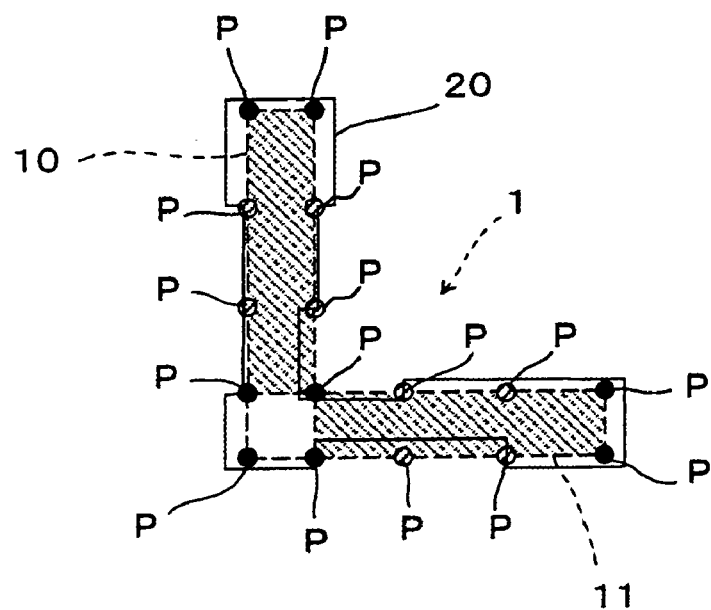

After positioning the new edge division points P1, as shown in FIG. 2B, the design pattern 1 divided by the edge division points P is corrected by adjusting the position of each edge portion to form the exposure mask pattern 20. At that time, light intensity simulation is performed using the centers between the edge division points P as evaluation points. Based on the obtained simulation results, the amounts of correction for the edges between the edge division points P is calculated and the positions of the edge portions are corrected by exactly the calculated amounts of correction. Further, the corner portions of the design pattern 1 (including the ends) are adjusted in accordance with the ordinary correction to obtain an exposure mask pattern 20 conforming with the transfer pattern.

Figure 3:
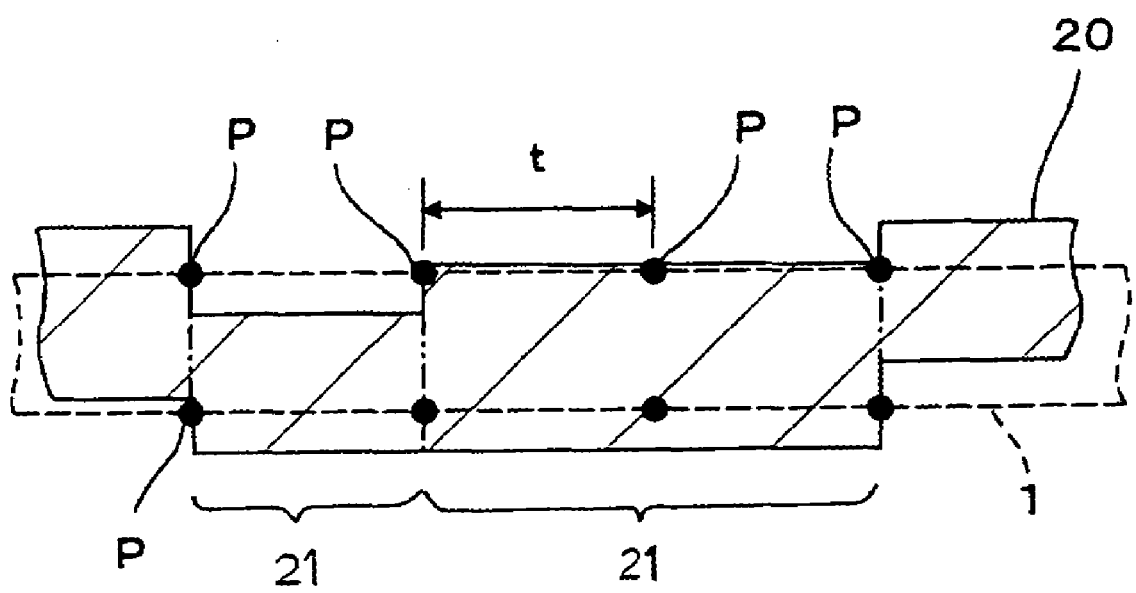
FIG. 3 is a view explaining fabrication of pattern data of an exposure mask pattern obtained by the present invention.

Further, when forming an exposure mask using the exposure mask pattern 20 obtained in the above way, as shown in FIG. 3, the exposure mask pattern 20 is divided into rectangular patterns and electron beam exposure is performed using each divided pattern 21 as a shot.

According to this method of forming an exposure mask pattern, as shown in FIG. 2A, since the edge division points P given to the two vertexes sharing a short side of each of the rectangular patterns 10 and 11 are used as start points $P_0$ and new edge division points $P(P_1)$ are provided from these start points $P_0$ at the long sides of each of the rectangular patterns 10 and 11 at predetermined intervals t, the edge division points $P(P_1)$ are provided at these facing sides (long sides) without deviation in the direction of extension of the long sides. Therefore, when correcting the edge position for each edge portion divided by the edge division points P, the corrected edge portions will never be arranged with a step difference in the direction of extension of the rectangular pattern 10 and 11. Therefore, the shape of the exposure mask pattern 20 can be simplified compared with the conventional correction where the edge portions are arranged with a step difference in the direction of extension. As a result, formation of an exposure mask pattern 20 having a guarantee against defects becomes easy and a transfer pattern having a high precision relative to the design pattern can be obtained by lithography using the exposure mask pattern 20.

Further, when using an exposure mask pattern 20 formed in this way to fabricate an exposure mask, as shown in FIG. 3, when dividing the exposure mask pattern 20 in the direction of extension of the facing sides (long sides) to divide it into the rectangular divided pattern 21 portions, the interval between the edge division points P (that is, t) becomes the minimum unit of division. Therefore, the number of the rectangular divided patterns 21 is kept to fewer than the number of portions between the edge division points P. As a result, an increase of the amount of the mask data and the number of the shots in exposure when producing the mask and the deterioration of the TAT (turn-around time) due to this can be prevented.

Figure 4A:
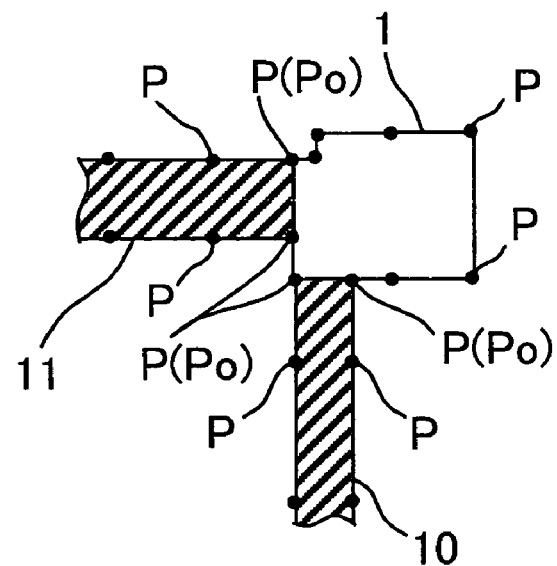
FIGS. 4A to 4C are views showing an example of formation of an exposure mask pattern obtained by the present invention and results of simulation.
Figure 4B:
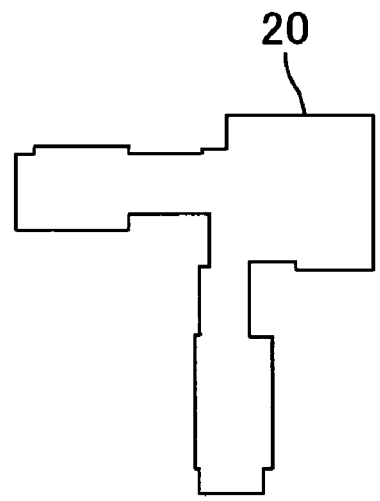
Figure 4C:
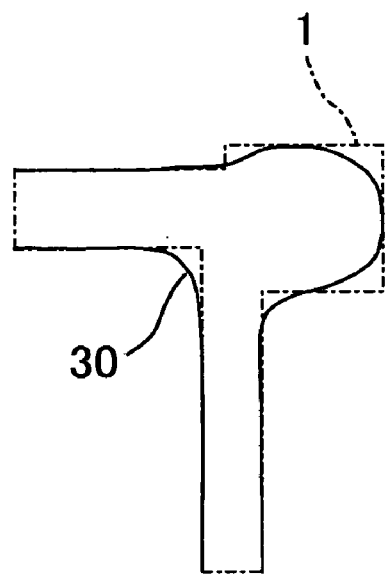

FIG. 4A to FIG. 4C show an example of the formation of an exposure mask pattern using the above method. Here, as shown in FIG. 4A, a design pattern 1 was formed with the rectangular patterns 10 and 11 and then successively provided with the edge division points P by the above method. Note that the edge division points P were provided not only at the rectangular patterns 10 and 11 from the start points $P_0$ successively at predetermined intervals t but also at the design pattern portion other than the rectangular patterns 10 and 11, if necessary. After that, as shown in FIG. 4B, the edge portions between the edge division points P were corrected in position to form the exposure mask pattern 20.

FIG. 4C shows a transfer pattern 30 of the design pattern 1 obtained using the above exposure mask pattern 20. This transfer pattern 30 was obtained by simulation of lithography using the exposure mask and can be confirmed to have been formed free from disconnections and with a good precision relative to the design pattern 1.

Figure 5A:
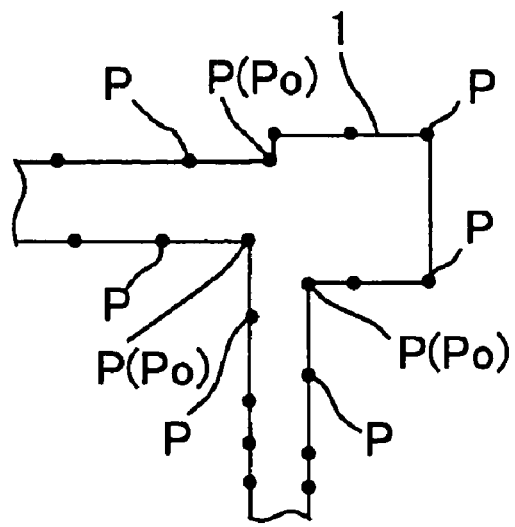
FIGS. 5A to 5C are views showing formation of an exposure mask pattern using the conventional model-base OPC and results of simulation.
Figure 5B:
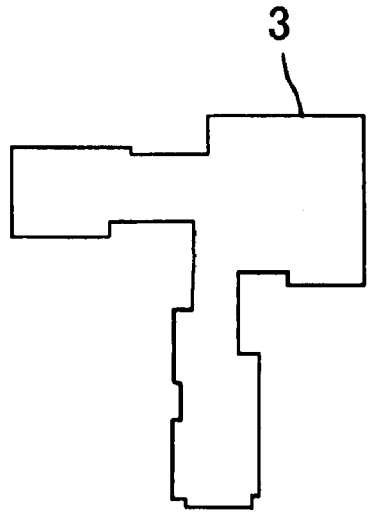
Figure 5C:
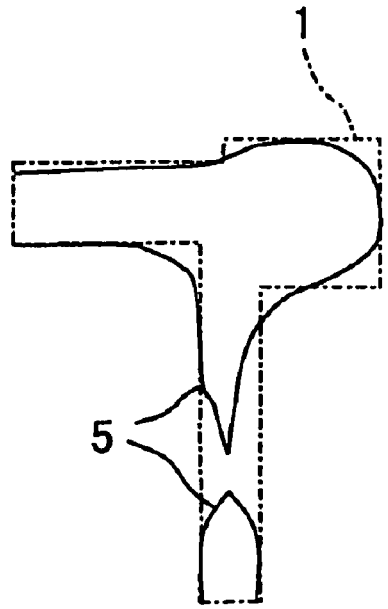

As opposed to this, FIG. 5A to FIG. 5C show formation of an exposure mask pattern using conventional model-base OPC as a comparative example. Here, first, as shown in FIG. 5A, edge division points $P(P_0)$ are given to vertexes of a design pattern 1, and these are used as start points $P_0$ for successively adding edge division points. Then, as shown in FIG. 5B, the edge portions between the edge division points P including the start points $P_0$ were corrected in position to form the exposure mask pattern 3. FIG. 5C shows the transfer pattern 5 obtained by using this exposure mask pattern 3. The transfer pattern 5 was obtained by the simulation of lithography using an exposure mask and had disconnections.

As explained above, according to the method of forming an exposure mask pattern and the exposure mask pattern according to the present embodiment, by using the vertexes of the rectangular patterns 10 and 11 generated at a design pattern 1 as start points $P_0$ to give edge division points $P(P_1)$, it becomes possible to form an exposure mask pattern without step differences between edges with facing correction positions among the edge division points $P(P_1)$.

Therefore, the shape of the exposure mask pattern is simplified, guarantee of the mask against defects becomes easy, and a transfer pattern high in precision relative to the design pattern can be formed. Further, the number of shots in exposure when producing the mask is reduced and the TAT (turn-around time) can be improved.

Further, the present invention can be applied to not only formation of an exposure mask pattern for an exposure mask for photo exposure but also formation of an exposure mask pattern for an exposure mask for electron beam exposure, X-ray exposure, ultraviolet exposure, EUV (extreme ultraviolet) exposure, ion beam exposure, etc. Further, the present invention can be applied not only to formation of an exposure mask pattern for an exposure mask but also formation of an exposure pattern for lithographic exposure. Similar effects can be obtained.

Here, in one of the next generation exposure technologies for taking the place of photolithography, that is, low energy electron proximity projection lithography (LEEPL), a stencil mask provided with aperture shaped exposure mask patterns in a membrane of a thickness of several 100 nm is used as the exposure mask.

Figure 6:
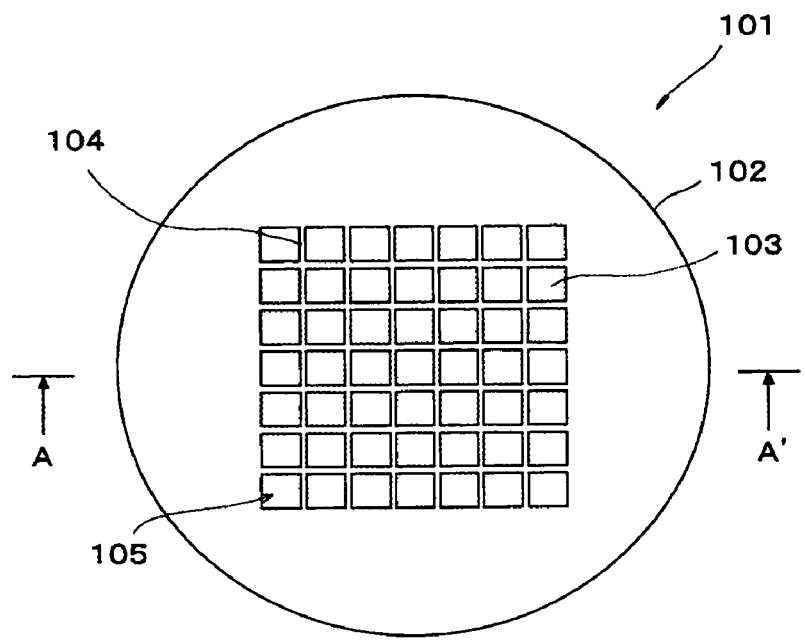
FIG. 6 is a plan view of the configuration of an example of an exposure mask constituted by a stencil mask.
Figure 7:
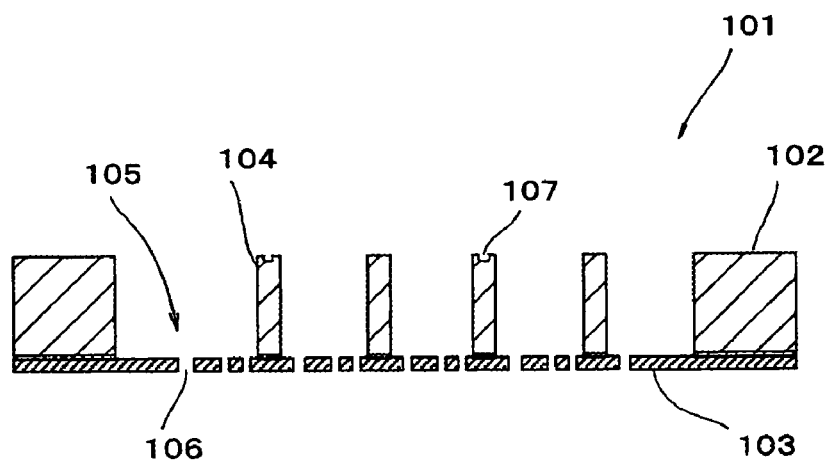
FIG. 7 is a cross-sectional view of an example of an exposure mask constituted by a stencil mask.
Figure 8:
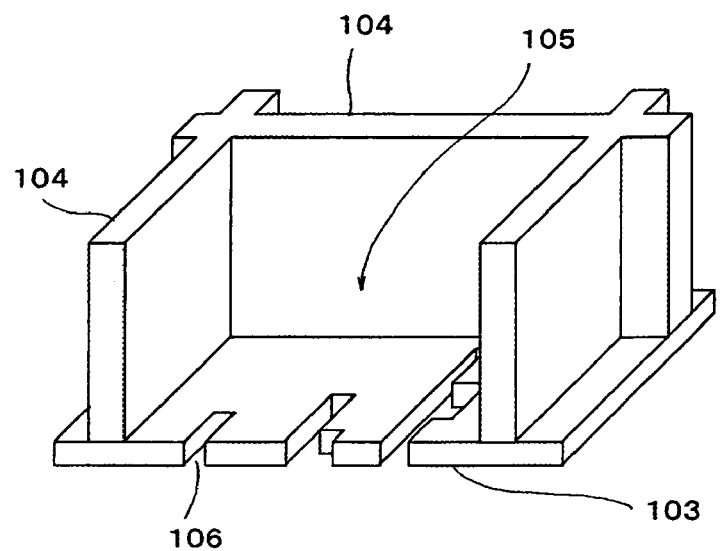
FIG. 8 is a partially enlarged perspective view of an example of an exposure mask constituted by a stencil mask.

FIG. 6 is a plan view of such a stencil mask; FIG. 7 is a cross-sectional view along the line A-A' of FIG. 6; and FIG. 8 is partial perspective view of FIG. 6. As shown in FIG. 6 to FIG. 8, the stencil mask 101 is constituted by a frame 102 formed by a silicon wafer, a membrane 103 stretched across one surface of the frame 102, and a grid 104 provided integral with the frame 102 at the inside of the frame 102 and supporting the membrane 103. The stencil mask 101 having such a configuration has membrane 103 portions divided by the grid 104 as pattern formation regions 105. These pattern formation regions 105 are formed with aperture shaped exposure mask patterns 106. Further, usually, the grid 104 is formed at the opposite surface to the surface supporting the membrane 103 with mask alignment marks 107.

When using a stencil mask 101 of this configuration for pattern exposure, the stencil mask 101 is arranged directly on the exposure surface so that the interval between the membrane 103 of the stencil mask 101 and the exposure surface becomes several 10 μm. In this state, the stencil mask 101 is scanned at the exposure mask pattern 106 formation regions by an electron beam of several to several 10 keV, whereby the electron beam passing through the exposure mask patterns 101 strikes the exposure surface and the exposure mask patterns 106 are transferred to the exposure surface.

However, in the case of a stencil mask of such a configuration, the problem that a donut-shaped aperture pattern cannot be formed as an exposure mask pattern and the problem that the membrane 103 warps when forming an exposure mask pattern long in one direction and positioning precision of the pattern becomes lower arise. Therefore, in the stencil mask 101, an exposure mask pattern 106 obtained by correction of the design pattern is formed in a state divided into a plurality of complementary masks (complementary division). Further, by using such complementary masks for overlapping exposure, exposure mask patterns are transferred at the exposure surface complementarily. Note that "complementary masks" mean the masks when dividing a pattern of a certain section for placement on different masks and superposing the masks to superpose the divided patterns and thereby form the pattern before division of that section.

According to the exposure mask pattern of the present embodiment, a fine pattern can be particularly effectively formed on a semiconductor substrate when using the above complementary divided stencil masks.

Figure 9:
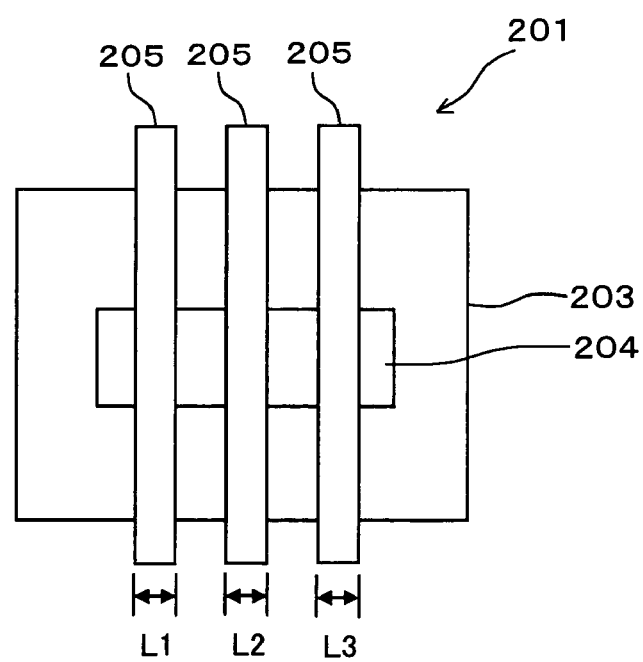
FIG. 9 is a plan view of a semiconductor device.

FIG. 9 is a plan view of an example of a semiconductor device formed using an exposure mask pattern according to the present embodiment. A semiconductor device 201 shown in this figure is formed at the front surface side of the semiconductor substrate with an element region 203 and an active region 204 and has a gate 205 of polycrystalline silicon or silicide, that is, it is a MOS transistor. In particular, for forming a fine pattern such as a gate length L1, L2, or L3, it is effective to use an exposure mask pattern according to the present embodiment.

Figure 10:
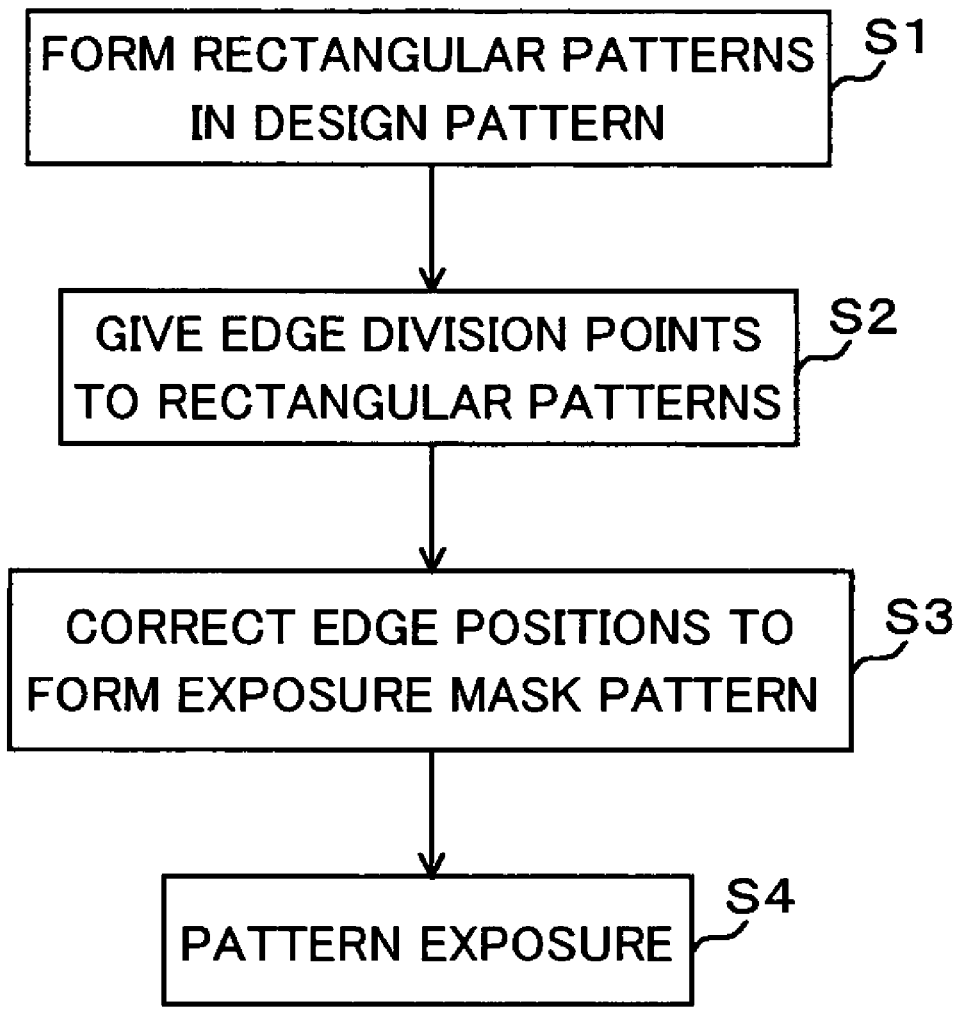
FIG. 10 is a flow chart explaining a method of producing a semiconductor device of the present invention.
Figure 11:
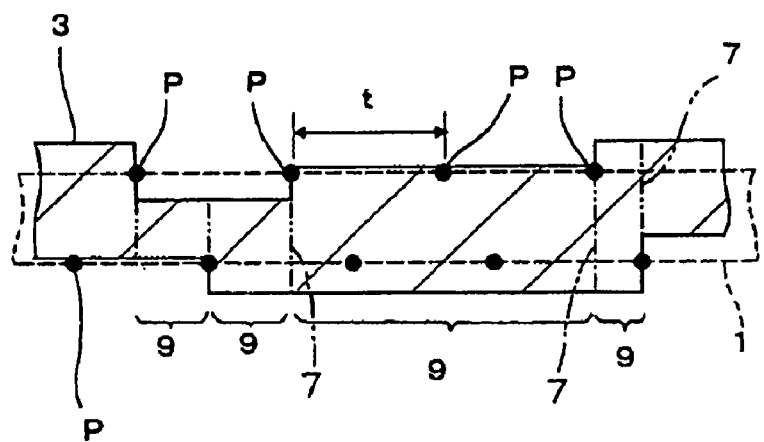
FIG. 11 is a view explaining formation of an exposure mask pattern using the conventional model-base OPC.
Figure 12:
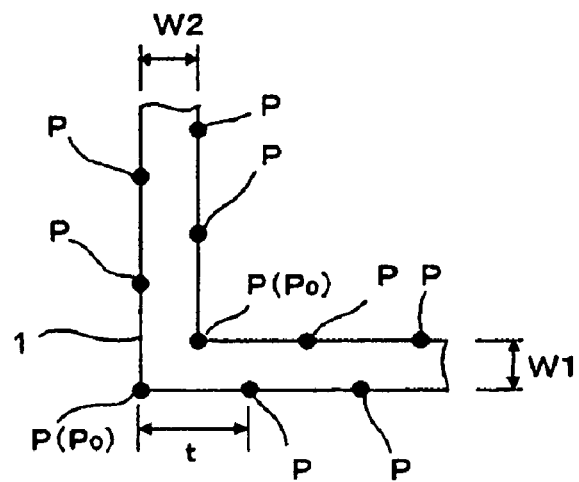
FIG. 12 is a view explaining giving edge division points in the conventional model-base OPC.

FIG. 10 is a flow chart of the method of producing a semiconductor device according to the present embodiment. The method of producing a semiconductor device according to the present embodiment should include the steps S1 to S4 shown in FIG. 10. That is, at step S1, a design pattern is formed with rectangular patterns using a pair of facing sides forming the design pattern. At step S2, two vertexes sharing one side of each rectangular pattern are used as start points, and edge division points are given from the start points to the facing sides at predetermined intervals. After this, at step S3, the edge portions divided by the edge division points are corrected in edge positions, and then the exposure mask pattern is formed. The above steps S1 to S3 are steps for forming the exposure mask pattern explained above. At step S4, the thus obtained exposure mask pattern is transferred by pattern exposure to the resist film on the semiconductor wafer.

According to such a method of producing a semiconductor device, an exposure mask pattern for forming a semiconductor device is formed according to the method of producing an exposure mask pattern explained above, so a transfer pattern having a high precision relative to the design pattern can be formed on the semiconductor wafer. Further, an increase of the amount of the mask data when forming the exposure mask pattern and the number of the shots in exposure when producing the mask and deterioration of the TAT (turn-around time) due to this can be prevented. As a result, the deterioration of the TAT of a semiconductor device can be prevented.

INDUSTRIAL APPLICABILITY

The method of forming an exposure mask pattern of the present invention can be applied to a method of forming an exposure mask pattern considering optical proximity effect correction. An exposure mask pattern of the present invention can be applied to an exposure mask pattern used when forming a transfer pattern close to a design pattern by lithography for example. The method of producing a semiconductor device of the present invention can be applied to a method of producing a semiconductor device forming a transfer pattern using an exposure mask pattern considering optical proximity effect correction.

The invention claimed is:

1. A method of forming an exposure mask pattern comprising the steps of:
    forming rectangular patterns in a design pattern using pairs of facing sides comprising said design pattern;
    using two vertexes sharing a first short side of said pairs of facing sides in each rectangular pattern as start points and giving edge division points from said start points to a second facing short side of said pairs of facing sides by predetermined intervals; and
    correcting the position of each edge portion divided by said edge division points.

2. A method of forming an exposure mask pattern as set forth in claim 1, wherein in the step of forming said rectangular patterns, portions of said design pattern in which widths between facing long sides of said pairs of facing sides are no more than a predetermined interval.

3. A method of forming an exposure mask pattern as set forth in claim 1, wherein said rectangular patterns are squares.

4. A method of forming an exposure mask pattern as set forth in claim 1, wherein said correcting of the position of each edge portion is by optical proximity effect correction.

5. A method of forming an exposure mask pattern as set forth in claim 1, wherein said predetermined intervals are a constant value.

6. An exposure mask pattern formed by the steps of:
    forming rectangular patterns in a design pattern using pairs of facing sides comprising said design pattern;
    dividing said pairs of facing sides into edge portions using pairs of start points and edge division points, by positioning two start points on opposite ends of a first short side of each rectangular pattern and placing edge division points at predetermined intervals along facing long sides of that rectangle from said start points to a second facing short side of said pairs of facing sides for that rectangle; and
    adjusting the position of each edge portion.

7. An exposure mask pattern as set forth in claim 6, wherein said rectangular patterns include squares.

8. An exposure mask pattern as set forth in claim 6, wherein said adjusting step corrects for optical proximity effects.

9. An exposure mask pattern as set forth in claim 6, wherein said predetermined intervals are a constant value.

10. A method of producing a semiconductor device comprising the steps of:
    forming an exposure mask pattern and transferring said exposure mask pattern by pattern exposure, said forming an exposure mask pattern comprising the steps of;
        forming rectangular patterns over a design pattern using pairs of facing sides comprising said design pattern, dividing said pairs of facing sides into edge portions using pairs of start points and edge division points, by positioning two start points on opposite ends of a first short side of each rectangular pattern and placing edge division points at predetermined intervals along facing long sides of that rectangle from said start points to a second facing short side of said pairs of facing sides for that rectangle, and adjusting the position of each edge portion.

11. A method of producing a semiconductor device as set forth in claim 10, wherein in the step of transferring said exposure mask pattern by pattern exposure, said exposure mask pattern is transferred by lithographic exposure.

12. A method of producing a semiconductor device as set forth in claim 10, wherein for each rectangular pattern, the distance between facing long sides of said pairs of facing sides for each rectangular pattern is no more than each of the predetermined intervals for the rectangular pattern.

13. A method of producing a semiconductor device as set forth in claim 10, wherein at least one of said rectangular patterns is a square.

14. A method of producing a semiconductor device as set forth in claim 10, wherein said adjusting step corrects optical proximity effects.

15. A method of producing a semiconductor device as set forth in claim 10, wherein said predetermined intervals are a constant value.

16. A method of producing a semiconductor device as set forth in claim 10, wherein said pattern exposure is electron beam exposure, X-ray exposure, ultraviolet exposure, extreme ultraviolet exposure, ion-beam exposure, or photo exposure.

17. An exposure mask pattern formed by the steps of:

identifying sections of a design pattern where the widths of the sections are not more than a maximum distance;

forming non-overlapping rectangular patterns having pairs of facing sides parallel to at least one edge of the design pattern over the identified sections of the design pattern where at least one of each pair of facing sides overlaps an edge of the design pattern;

positioning two start points on one side of each rectangular pattern, where the one side is not one of the pairs of facing sides;

dividing the pairs of facing sides into edge portions using edge division points positioned on said pairs of facing sides at predetermined intervals beginning with the start points; and adjusting the position of each edge portion.

18. An exposure mask pattern as set forth in claim 17, wherein said adjusting step corrects for optical proximity effects.

19. An exposure mask pattern as set forth in claim 17, wherein the pairs of facing sides are longer than the one side on which the starting points are positioned.

* * * * *

UNITED STATES PATENT AND TRADEMARK OFFICE
CERTIFICATE OF CORRECTION

PATENT NO. : 7,384,710 B2  Page 1 of 1
APPLICATION NO. : 10/503363
DATED : June 10, 2008
INVENTOR(S) : Kazuhisa Ogawa et al.

It is certified that error appears in the above-identified patent and that said Letters Patent is hereby corrected as shown below:

On the title page; item [57]: Abstract:
Line 6 should read -- pattern (1). At that time, the rectangular patterns (10) and (11) are --.

Signed and Sealed this

Nineteenth Day of August, 2008

JON W. DUDAS
*Director of the United States Patent and Trademark Office*